(12) United States Patent
Fujikawa

(10) Patent No.: US 10,907,272 B2
(45) Date of Patent: Feb. 2, 2021

(54) METHOD OF MANUFACTURING SILICON CARBIDE SINGLE CRYSTAL INGOT

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 91 days.

(21) Appl. No.: 16/221,671

(22) Filed: Dec. 17, 2018

(65) Prior Publication Data

US 2019/0194819 A1  Jun. 27, 2019

(30) Foreign Application Priority Data

Dec. 22, 2017  (JP) .................. 2017-246605

(51) Int. Cl.
*C30B 23/02* (2006.01)
*C30B 23/00* (2006.01)
(Continued)

(52) U.S. Cl.
CPC ............ *C30B 23/002* (2013.01); *C30B 29/36* (2013.01); *C30B 35/002* (2013.01)

(58) Field of Classification Search
CPC ......... C30B 29/36; C30B 23/00; C30B 23/02; C30B 23/002
See application file for complete search history.

(56) References Cited

U.S. PATENT DOCUMENTS

2010/0080965 A1* 4/2010 Reid ........................ G09F 19/22
428/195.1
2016/0083865 A1* 3/2016 Sakurada ................ C30B 29/36
117/84

FOREIGN PATENT DOCUMENTS

CN    1973064 A    5/2007
CN    102400224 A  4/2012
(Continued)

OTHER PUBLICATIONS

Office Action dated Aug. 13, 2020, from the China National Intellectual Property Administration in Application No. 201811514867.3.

*Primary Examiner* — Robert M Kunemund
(74) *Attorney, Agent, or Firm* — Sughrue Mion, PLLC

(57) ABSTRACT

The present invention provides a method including: a temperature raising step of raising a temperature in a crystal growing furnace with a silicon carbide raw material and a silicon carbide seed crystal arranged therein to a crystal growing temperature; a single crystal growing step of maintaining the crystal growing temperature and causing a silicon carbide single crystal to grow on the silicon carbide seed crystal; and a temperature lowering step of lowering the temperature in the crystal growing furnace from the crystal growing temperature to stop growth of the silicon carbide single crystal, in which the method further comprises, between the single crystal growing step and the temperature lowering step, a temperature lowering preparation step of maintaining the temperature in the crystal growing furnace at the crystal growing temperature and causing concentration of nitrogen gas in the crystal growing furnace to increase to be higher than concentration of nitrogen gas in the temperature raising step and in the single crystal growing step, and in which the concentration of the nitrogens gas in the crystal growing furnace in the temperature lowering step is higher than the concentration of the nitrogen gas in the temperature raising step and the single crystal growing step.

7 Claims, 3 Drawing Sheets

(51) Int. Cl.
   *C30B 35/00*  (2006.01)
   *C30B 29/36*  (2006.01)

(56) References Cited

FOREIGN PATENT DOCUMENTS

| | | |
|---|---|---|
| CN | 106894089 A | 6/2017 |
| CN | 107002281 A | 8/2017 |
| JP | 6-219898 A | 8/1994 |
| JP | 2001-114599 A | 4/2001 |

\* cited by examiner

METHOD OF MANUFACTURING SILICON CARBIDE SINGLE CRYSTAL INGOT

BACKGROUND OF THE INVENTION

Field of the Invention

The present invention relates to a method of manufacturing a silicon carbide single crystal ingot using a sublimation recrystallization method.

Priority is claimed on Japanese Patent Application No. 2017-246605, filed on Dec. 22, 2017, the content of which is incorporated herein by reference.

Description of Related Art

Silicon carbide (SiC) has a larger electric breakdown field than that of Silicon (Si) by a degree of magnitude and has a greater band gap by three times. Also, silicon carbide (SiC) has properties such as higher thermal conductivity than that of silicon (Si) by about three times. Applications of silicon carbide (SiC) to a power device, a high-frequency device, a high-temperature operation device, and the like have been expected.

A silicon carbide single crystal is typically manufactured by a sublimation recrystallization method. The sublimation recrystallization method is a method in which gas such as Si, $Si_2C$, or $SiC_2$ generated by sublimating a silicon carbide raw materials is recrystallized on a silicon carbide seed crystal, thereby causing crystal growth (see Patent Document 1, for example). As a method of manufacturing a silicon carbide single crystal with high quality and a large diameter using such a sublimation recrystallization method, a modified Rayleigh method is an exemplary example, for example.

According to the modified Rayleigh method, silicon carbide raw material powder and a silicon carbide seed crystal are arranged in a crystal growing furnace which is, for example, made of a graphite crucible. Then, the inside of the crystal growing furnace is heated to a crystal growing temperature at which the silicon carbide raw material powder is sublimated, for example, 2000° C. or higher (temperature raising step). Then, raw material gas is recrystallized on the silicon carbide seed crystal using a temperature difference in the crystal growing furnace while the crystal growing temperature is maintained, thereby causing a silicon carbide single crystal to grow (single crystal growing step). Then, if the silicon carbide single crystal grows up to a target size, the temperature in the crystal growing furnace is lowered (temperature lowering step).

PRIOR ART DOCUMENTS

Patent Documents

Patent Document 1: Japanese Unexamined Patent Application, First Publication No. 2001-114599

SUMMARY OF THE INVENTION

In manufacturing a silicon carbide single crystal by the aforementioned sublimation recrystallization method, it is necessary to heat the temperature in the crystal growing furnace to 2000° C. or higher in the single crystal growing step. Therefore, it takes a long time to perform the temperature lowering step for cooling the silicon carbide single crystal from such a high-temperature state to room temperature, which makes it difficult to improve productivity.

The invention was made in view of the aforementioned circumstances and provides a method of manufacturing a silicon carbide single crystal ingot capable of improving manufacturing efficiency of a silicon carbide single crystal by shortening a time required for a temperature lowering step after growth of a silicon carbide single crystal when the silicon carbide single crystal is manufactured by a sublimation recrystallization method.

The present inventor has intensively studied a relationship between an atmosphere in a crystal growing furnace and a temperature lowering time in a temperature lowering step performed after growing a silicon carbide single crystal and has found as a result that it is possible to shorten the temperature lowering time by increasing concentration of nitrogen gas in the crystal growing furnace.

In order to solve the aforementioned problems, there is provided a method of manufacturing a silicon carbide single crystal ingot in which a silicon carbide single crystal is made to grow on a silicon carbide seed crystal in an environment at a temperature of 2000° C. or higher in a crystal growing furnace, the method including: a temperature raising step of raising a temperature in the crystal growing furnace with a silicon carbide raw material and the silicon carbide seed crystal arranged therein to a crystal growing temperature; a single crystal growing step of maintaining the crystal growing temperature and causing the silicon carbide single crystal to grow on the silicon carbide seed crystal; and a temperature lowering step of lowering the temperature in the crystal growing furnace from the crystal growing temperature to stop growth of the silicon carbide single crystal, in which the method further comprises, between the single crystal growing step and the temperature lowering step, a temperature lowering preparation step of maintaining the temperature in the crystal growing furnace at the crystal growing temperature, and concentration of nitrogen gas in the crystal growing furnace is made to increase to be higher than concentration of nitrogen gas in the temperature raising step and in the single crystal growing step, and in which the concentration of the nitrogen gas in the crystal growing furnace in the temperature lowering step is higher than the concentration of the nitrogen gas in the temperature raising step and the single crystal growing step.

According to the invention, an endothermic reaction of nitrogen is promoted by increasing the concentration of nitrogen gas in the temperature lowering step than that in the temperature raising step and the single crystal growing step. In this manner, it is possible to shorten a time required for the temperature lowering step in the crystal growing furnace and to improve production efficiency of the silicon carbide single crystal.

The manufacturing method according to a first aspect of the invention preferably includes the following features. The following features are preferably combined with each other.

In the invention, it is preferable that the temperature lowering preparation step is performed within a range of equal to or greater than 5 hours and equal to or less than 15 hours.

In the invention, it is preferable that the concentration of the nitrogen gas in the crystal growing furnace in the temperature lowering step is equal to or greater than 30 vol %.

In the invention, it is preferable that in the temperature lowering step, a temperature lowering speed is increased by an endothermic reaction of nitrogen gas in the crystal growing furnace.

In the invention, it is preferable that the method of manufacturing a silicon carbide single crystal ingot is a sublimation method.

According to the invention, it is possible to provide a method of manufacturing a silicon carbide single crystal ingot capable of improving manufacturing efficiency of a silicon carbide single crystal by shortening a time required for a temperature lowering step after growth of a silicon carbide single crystal when the silicon carbide single crystal is manufactured by a sublimation recrystallization method.

DETAILED DESCRIPTION OF THE INVENTION

Figure 1:
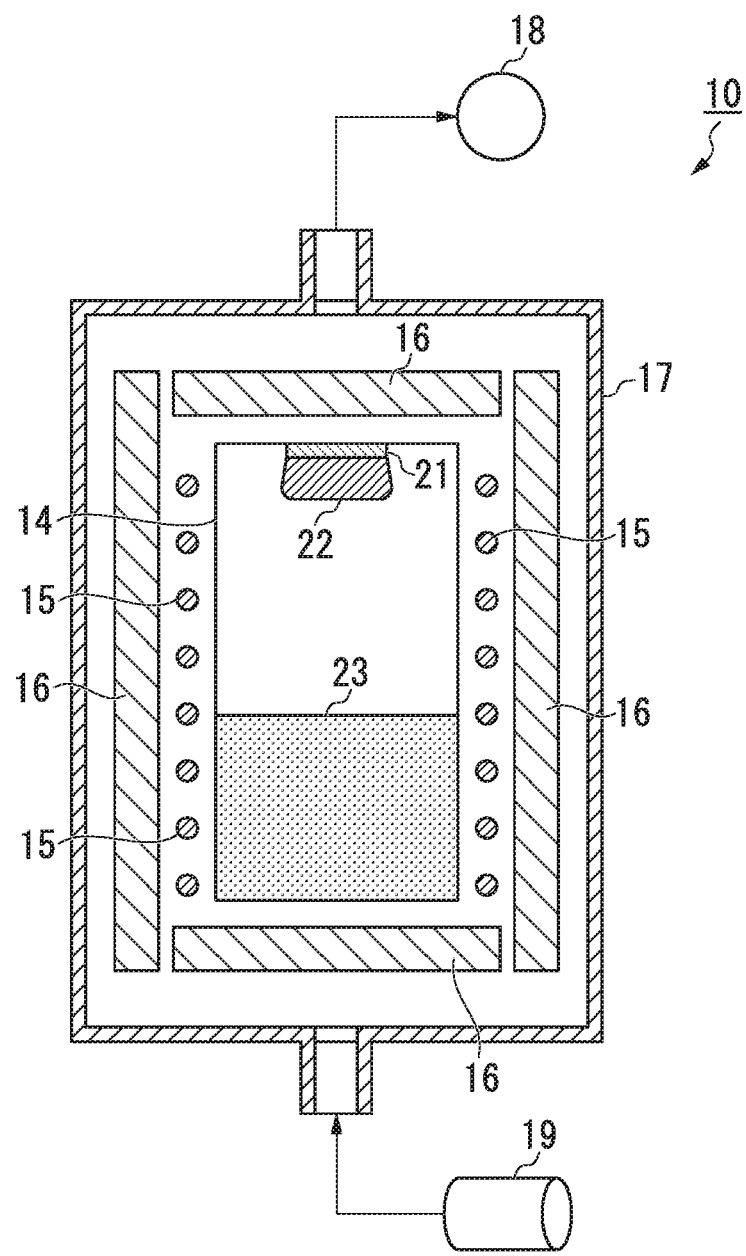
FIG. 1 is a schematic sectional view showing an example of a silicon carbide single crystal manufacturing apparatus that is used in a method of manufacturing a silicon carbide single crystal ingot according to the invention.

Hereinafter, a method of manufacturing a silicon carbide single crystal ingot according to an embodiment of the invention will be described with reference to drawings.

The invention can provide a method of manufacturing a silicon carbide single crystal ingot which is capable of improving manufacturing efficiency of a silicon carbide single crystal by shortening a time required for a temperature lowering step performed after growth of a silicon carbide single crystal, when the silicon carbide single crystal is manufactured by a sublimation recrystallization method.

Note that the respective embodiments and examples given below are for providing specific description to easily understand the point of the invention and are not intended to limit the invention unless otherwise particularly designated.

In addition, a part that is considered to be a main part is shown in an enlarged manner in the drawing used in the following description in some cases for convenience in order to facilitate understanding of features of the invention, and dimensions, ratios and the like of the respective components may be the same as or different from actual dimensions, ratios and the like.

FIG. 1 is a schematic sectional view showing an example of a silicon carbide single crystal manufacturing apparatus used in a method of manufacturing a silicon carbide single crystal ingot according to the invention.

A silicon carbide single crystal manufacturing apparatus 10 is an apparatus that causes a silicon carbide single crystal 22 to grow by a sublimation recrystallization method (sublimation method). That is, the silicon carbide single crystal manufacturing apparatus 10 sublimates a silicon carbide raw material 23 containing silicon carbide by heating the silicon carbide raw material 23 and generates sublimation gas such as Si, $Si_2C$, or $SiC_2$. Further, the silicon carbide single crystal 22 is made to grow on a plane of a silicon carbide seed crystal 21 by recrystallizing (precipitate) the sublimation gas on the plane of the silicon carbide seed crystal 21 disposed in the apparatus.

The silicon carbide single crystal manufacturing apparatus 10 includes a crystal growing furnace (crucible) 14, a heating means (heater) 15 for heating the crystal growing furnace 14, a heat insulating material 16 that covers the crystal growing furnace 14 and the heating means 15, and a chamber 17 that accommodates these elements. Also, a decompression means (vacuum pump) 18 for decompressing the inside of the chamber 17 and a gas supply means 19 that introduces atmosphere gas in the crystal growing furnace 14 are connected to the chamber 17.

The silicon carbide seed crystal 21 and the silicon carbide raw material 23 are arranged inside the crystal growing furnace (crucible) 14. As the crystal growing furnace 14, a known crucible can preferably be used as long as the crucible is for manufacturing the silicon carbide single crystal 22 by a sublimation method. For example, a crucible of graphite, tantalum carbide, or the like can be used. The temperature in the crystal growing furnace 14 becomes high during growth. Therefore, it is necessary that the crystal growing furnace is formed by a material capable of bearing a high temperature. For example, a sublimation temperature of graphite is as significantly high as 3550° C., ad graphite can bear the high temperature during growth.

The heating means (heater) 15 can arbitrarily be selected, and for example, the heating means 15 is formed of a high-frequency heating coil with a coil shape that covers an outer periphery of the crystal growing furnace 14. Note that such a heating means 15 may be means other than the high-frequency heating coil, and for example, the heating means may be a graphite heater of a resistance heating type or the like.

The heat insulating material 16 is a member that prevents heat of the heated crystal growing furnace 14 from being released to the outside. The heat insulating material can be formed by an arbitrarily selected material, and for example, the heat insulating material may be formed of a carbon felt material. Since the carbon felt material has an excellent heat insulating effect and can suppress a change in growth conditions during growth of the silicon carbide single crystal 22, the carbon felt material contributes to manufacturing of the silicon carbide single crystal 22 with satisfactory crystal characteristics.

The chamber 17 accommodates the crystal growing furnace 14, the heating means 15, and the heat insulating material 16 therein in an air tight manner. In this manner, it is possible to maintain the inside of the crystal growing furnace 14 in a decompressed (vacuum) environment or an ordinary pressure environment.

Various known vacuum pumps can preferably be applied to the decompression means (vacuum pump) 18, for example. It is possible to maintain the inside of the crystal growing furnace 14 in a decompressed environment from a crystal growing step to the temperature lowering step in the method of manufacturing a silicon carbide single crystal ingot, which will be described later, by employing such a decompression means 18. In addition, the decompression means 18 can also be used to discharge NOx that is a compound of nitrogen and oxygen generated inside the crystal growing furnace 14 at the high temperature. The position of the decompression means 18 and the communicating position of the chamber 17 and the decompression means 18 can arbitrarily be selected.

The gas supply means 19 supplies gas of a predetermined type into the crystal growing furnace 14 and changes the inside of the crystal growing furnace 14 into an atmosphere of specific gas. In the invention, the gas supply means 19 supplies inert gas containing nitrogen gas. Nitrogen gas, mixture gas of nitrogen gas and argon gas, and the like are exemplary examples, for example as the inert gas supplied from the gas supply means 19. Also, helium gas, neon gas, krypton gas, xenon gas, a combination thereof, or the like can also be used as the inert gas supplied along with the nitrogen gas. The position of the gas supply means 19 and the communicating position of the chamber 17 and the gas supply means 19 can arbitrarily be selected. The communicating position (for example, an opening portion of the chamber 17) of the chamber 17 and the decompression means 18 and the communicating position of the chamber 17 and the gas supply means 19 may be positions facing one another with the crystal growing furnace 14, the heating means 15, and the heat insulating material 16 interposed therebetween.

A crystal structure of the silicon carbide seed crystal 21 arranged in the crystal growing furnace 14 when the silicon carbide single crystal 22 is developed is not particularly limited. The silicon carbide seed crystal 21 may have the same crystal structure as that of the silicon carbide single crystal 22 to be made to grow or may have a different crystal structure therefrom. From a viewpoint of improving crystal characteristics of the silicon carbide single crystal 22 to be made to grow, it is preferable to select the silicon carbide seed crystal 21 that has the same crystal structure as that of the silicon carbide single crystal 22 to be made to grow.

The silicon carbide raw material 23 may have a powder form or may be a sintered body with a bulk shape. In the embodiment, polycrystalline silicon carbide powder is used as the silicon carbide raw material 23. By using the silicon carbide raw material 23 in the powder form, it is possible to further facilitate the sublimation as compared with the one with the bulk shape.

The silicon carbide single crystal manufacturing apparatus 10 with the aforementioned configuration can supply atmospheric gas of an arbitrary composition containing nitrogen from the gas supply means 19 in the method of manufacturing a silicon carbide single crystal ingot, which will be described later. Therefore, it is possible to freely control the concentration of the nitrogen gas in the crystal growing furnace 14 when the silicon carbide single crystal 22 is developed.

Method of Manufacturing Silicon Carbide Single Crystal Ingot

Next, a preferred embodiment of the method of manufacturing a silicon carbide single crystal ingot according to the invention using the aforementioned silicon carbide single crystal manufacturing apparatus 10 will be described.

Figure 2:
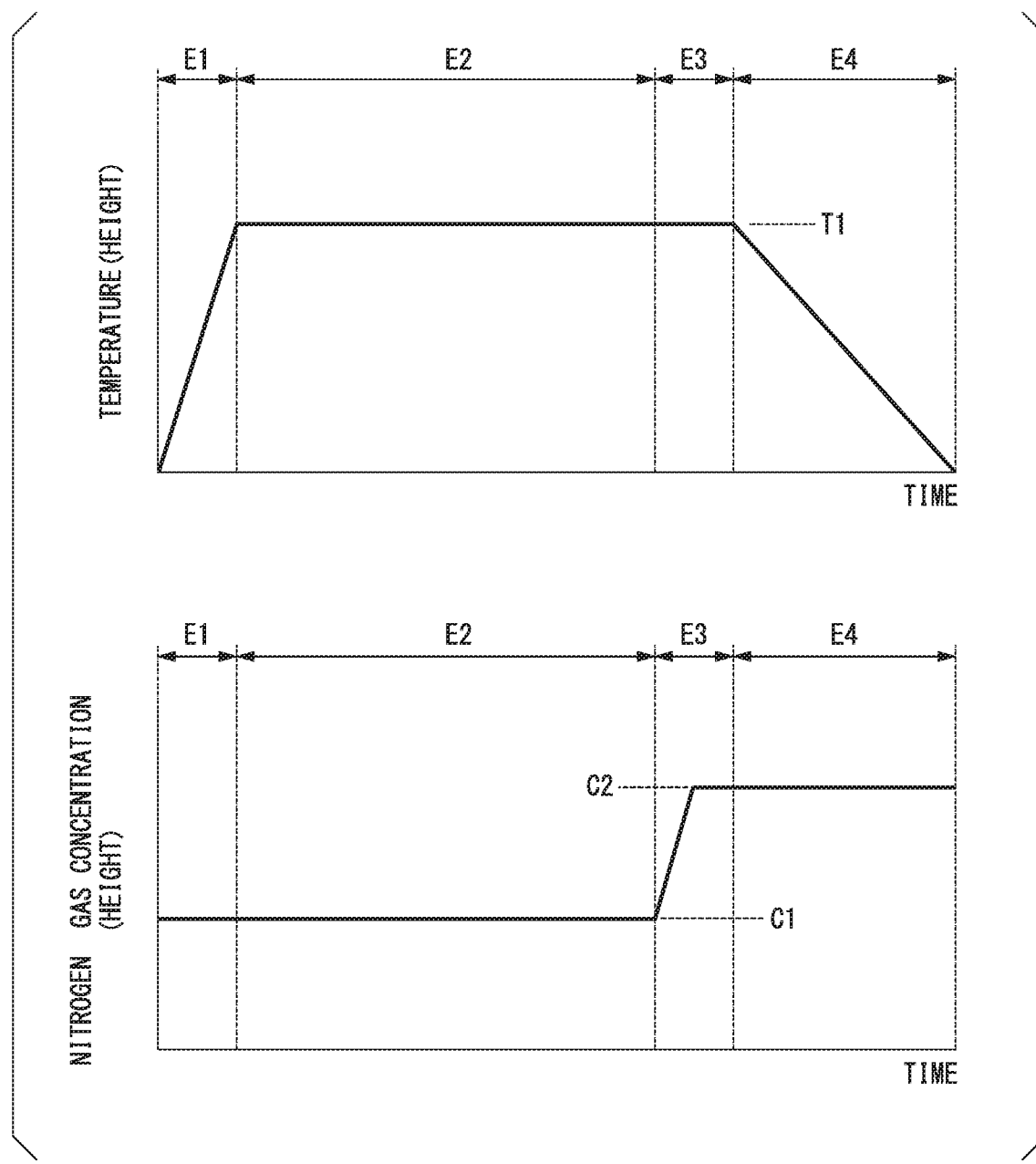
FIG. 2 is graphs showing an example of changes in temperatures in the crystal growing furnace and changes in concentration of nitrogen gas in the respective steps that are included in the method of manufacturing a silicon carbide single crystal ingot according to the invention.

FIG. 2 is an example of graphs showing changes in temperatures in the crystal growing furnace and changes in concentration of nitrogen gas in the respective steps that are included in the method of manufacturing a silicon carbide single crystal ingot according to the invention. Note that these graphs represent how the respective matters change.

The method of manufacturing a silicon carbide single crystal ingot according to the invention includes a temperature raising step E1 in which the temperature in the crystal growing furnace 14 is raised to a predetermined crystal growing temperature T1, a single crystal growing step E2 in which the silicon carbide single crystal 22 is made to grow while the crystal growing temperature T1 is maintained, and a temperature lowering step E4 in which the temperature in the crystal growing furnace 14 is lowered from the crystal growing temperature T1 to stop the growth of the silicon carbide single crystal 22, and the method further includes a temperature lowering preparation step E3, which is provided between the single crystal growing step E2 and the temperature lowering step E4, in which the concentration of the nitrogen gas in the crystal growing furnace 14 is increased to be higher than the concentration of the nitrogen gas C1 in the temperature raising step E1 and the single crystal growing step E2 while the temperature in the crystal growing furnace 14 is maintained at the crystal growing temperature T1.

Step E1

When the silicon carbide single crystal 22 is manufactured using the method of manufacturing a silicon carbide single crystal ingot according to the invention, the silicon carbide raw material 23 and the silicon carbide seed crystal 21 are disposed first in the crystal growing furnace 14, the heating means 15 is then made to operate, and the temperature in the crystal growing furnace 14 is raised from the room temperature to the crystal growing temperature T1, for example 2400° C. (temperature raising step E1). If the temperature in the crystal growing furnace 14 is raised to the crystal growing temperature T1, sublimation gas is generated from the silicon carbide raw material 23, and crystal growth is started. The crystal growing temperature can arbitrarily be selected, and for example, 2000 to 2500° C. is exemplary as a preferred example.

In such a temperature raising step E1, control is performed such that the concentration of nitrogen gas in the crystal growing furnace 14 is the initial setting concentration C1. The initial setting concentration C1 of the concentration of the nitrogen gas is preferably less than 30 vol %, for example, 15 vol %. The lower limit of the initial setting concentration C1 can arbitrarily be selected and is selected from values that are greater than 0 vol %, for xample. In a specific example, the lower limit value is preferably selected from 1 vol %, 3 vol %, 5 vol %, and the like. Such concentration of the nitrogen gas in the crystal growing furnace 14 can be realized by controlling the flow rate of the nitrogen gas or the mixture gas containing nitrogen gas to be supplied from the gas supply means 19. The concentration of the nitrogen gas can be controlled by the amount of gas that flows into the crystal growing furnace. The time required to perform the temperature raising step E1 can arbitrarily be selected and may be 3 to 15 hours, for example.

Step 2

Next, if the temperature in the crystal growing furnace 14 reaches the crystal growing temperature T1 in the temperature raising step E1, the heating means 15 is controlled such that the temperature in the crystal growing furnace 14 is maintained at the crystal growing temperature T1 (single crystal growing step E2). In the single crystal growing step E2, sublimation gas is continuously generated by the temperature in the crystal growing furnace 14 being maintained at the crystal growing temperature T1, the sublimation gas is recrystallized on the plane of the silicon carbide seed crystal 21 with a surface temperature that is slightly lower than that of the silicon carbide raw material 23, and the silicon carbide single crystal 22 grows. The concentration of the nitrogen gas in the crystal growing furnace 14 is also preferably maintained at the initial setting concentration C1, for example, 20 vol % in such a single crystal growing step E2. In the steps E1 and E2, the concentration of the nitrogen gas is preferably maintained to be constant.

The time required to perform the single crystal growing step E2 can arbitrarily be selected and may be 20 to 40 hours, for example.

Note that the silicon carbide single crystal ingot according to the invention can preferably manufacture an n-type 4H—SiC substrate for use in an electronic device.

Nitrogen is added as a dopant to the n-type 4H—SiC substrate for use in an electronic device. In order to add nitrogen, nitrogen gas is introduced during the growth. The nitrogen gas is reacted on the crystal plane at a high temperature, and nitrogen atoms are doped in the SiC single crystal. The amount of doped nitrogen depends on the concentration of nitrogen gas C1, and the amount of doped nitrogen increases as the concentration of the nitrogen gas increases. The obtained SiC single crystal expresses electric conductivity accordance with the amount of doped nitrogen. That is, a specific electrical resistance of a wafer is decided by the concentration of the nitrogen gas C1 during the growth of the single crystal.

In a case in which the 4H—SiC single crystal substrate is used for an electronic device, the substrate is required to have a specific electrical resistance of about equal to or greater than 15 mΩcm and equal to or less than 25 mΩcm. During the growth of the single crystal to obtain the SiC single crystal with specific electrical resistance within this range, the concentration of the nitrogen gas C1 is equal to or greater than 5 vol % and equal to or less than 25 vol % although it depends on growth conditions to some extent.

In a case in which the amount of doped nitrogen is excessively large, there is a problem that lamination defects further tend to occur as the amount of doped nitrogen increases. It is known that the lamination defects on the plane of the substrate are taken over by epitaxial growth, which leads to a defective device. Therefore, the concentration of the nitrogen gas C1 must be low during the growth of the single crystal, and it is typically desirable that the concentration of the nitrogen gas is equal to or less than 20 vol %.

That is, the concentration of the nitrogen gas during the growth of an ordinary n-type SiC single crystal is typically maintained within a specific range that is decided on the basis of the amount of the doped nitrogen.

In the single crystal growing step E2, the silicon carbide single crystal 22 is made to grow until the length of the crystal becomes about 10 to 50 mm, for example. An average growing speed of the silicon carbide single crystal 22 is not particularly limited and may be about 0.1 mm/h to 0.8 mm/h, for example. Such a single crystal growing step E2 may be performed in about 100 h in total.

Step 3

If the silicon carbide single crystal 22 grows to the predetermined length, then the temperature lowering preparation step E3 is performed as a preprocess of the temperature lowering step E4. In the temperature lowering preparation step E3, the gas supply means 19 is controlled such that the concentration of the nitrogen gas in the crystal growing furnace 14 is increased to be higher than the initial setting concentration C1, which is the concentration of the nitrogen gas in the temperature raising step E1 and the single crystal growing step E2, and reaches concentration during the temperature lowering C2, while the temperature in the crystal growing furnace 14 is maintained at the crystal growing temperature T1. That is, the concentration of the nitrogen gas in the crystal growing furnace 14 is increased to the concentration during the temperature lowering C2 through the temperature lowering preparation step E3. As the concentration during the temperature lowering C2, the concentration of the nitrogen gas in the crystal growing furnace 14 is equal to or greater than 30 vol %, for example, equal to or greater than 40 vol %, more preferably equal to or greater than 50 vol %. The upper limit can arbitrarily be selected, and for example, exemplary examples of the upper limits is equal to or less than 100 vol %, equal to or less than 95 vol %, equal to or less than 90 vol %, equal to or less than 85 vol %, and the like.

A setting time for the temperature lowering preparation step E3, that is, a time required to perform the step E3 is a time required to change the concentration of the nitrogen gas in the crystal growing furnace 14 to the concentration during the temperature lowering C2 and changes depending on an inner volume of the crystal growing furnace 14. The setting time for the temperature lowering preparation step E3 can arbitrarily be selected, and for example, the setting time is equal to or greater than 5 h (hours) and equal to or less than 15 h. Such a setting time for the temperature lowering preparation step E3 may be set to be as short as possible as long as it is possible to instantaneously increase the concentration of the nitrogen gas in the crystal growing furnace 14 from the initial setting concentration C1 to the concentration during the temperature lowering C2, for example. Under such a condition, the setting time may be equal to or greater than 1 h and equal to or less than 5 h or the like. That is, it is only necessary for the setting time for the temperature lowering preparation step E3 to be a time required to complete the change of the concentration of the nitrogen gas in the crystal growing furnace 14 to the concentration during the temperature lowering C2 before the point at which the temperature lowering step E4 is started.

Also, the crystal growth is also continued in the temperature lowering preparation step E3. Since a nitrogen-doped region included in the obtained silicon carbide single crystal 22 becomes excessively large if the temperature lowering preparation step E3 is performed for an excessively long time, there is a probability that faults due to lamination defects occur. Therefore, it is desirable that the temperature lowering preparation step is performed for 15 h or less.

Note that since the temperature in the crystal growing furnace 14 is maintained at the crystal growing temperature T1 in the temperature lowering preparation step E3, the silicon carbide single crystal 22 continues to grow. Therefore, it is also possible to state that the temperature lowering preparation step E3 is a step for increasing the concentration of the nitrogen gas before the temperature lowering step E4, as a part of a final stage of the single crystal growling step E2.

Step E4

If the concentration of the nitrogen gas in the crystal growing furnace 14 is increased to the concentration during the temperature lowering C2 through the temperature lowering preparation step E3, the processing proceeds to the temperature lowering step E4. In the temperature lowering step E4, the operation of the heating means 15 is stopped. In this manner, generation of sublimation gas caused by sublimation of the silicon carbide raw material 23 is stopped, and the growth of the silicon carbide single crystal 22 is stopped.

Then, the concentration of the nitrogen gas in the crystal growing furnace 14 in the temperature lowering step E4 has been increased to the concentration during the temperature lowering C2 that is higher than the initial setting concentration C1, which is the concentration of the nitrogen gas in the temperature raising step E1 and the single crystal growing step E2, due to the temperature lowering preparation step E3 performed as a preprocess. Under such a condition, the nitrogen gas in the crystal growing furnace 14 reacts with oxygen and the like contained in a furnace wall and the heat insulating material 16 that are included in the crystal growing furnace 14. In one example, generation of nitrogen monoxide caused by a reaction between nitrogen and oxygen is an endothermic reaction as represented by Formula (1).

$$N_2 + O_2 = 2NO - 43 \text{ kcal} \qquad (1)$$

Although the nitrogen molecule is substantially inert within a range of equal to or less than 1000° C. since bond dissociation energy of a triple bond of a nitrogen molecule is as high as 942 kJ/mol, the bond is dissociated, and the nitrogen molecule tends to react with other substances if the temperature exceeds 1000° C. Since carbons that are used for the heater and the heat insulating material are present in the crystal growing furnace 14 in addition to moisture and oxygen remaining due to adsorption and the like to the heat insulating material, the reaction occurs in a complicated manner in a high-temperature environment of equal to or greater than 1000° C. Bond energy of the bond that is considered to occur due to the reaction between these and nitrogen is 201 kJ/mol for N—O, 607 kJ/mol for N=O, 305 kJ/mol for C—N, 615 kJ/mol for C=N, 887 kJ/mol for C≡N, and 386 kJ/mol for H—N. All of them are smaller than 942 kJ/mol for N≡N. Therefore, the reaction in which the nitrogen molecule is involved is an endothermic reaction as a whole even if the reaction occurs in a complicated manner.

It is possible to shorten the necessary time for the temperature lowering step E4 in which it is difficult to cool the face crystal growing furnace 14 since the crystal growing furnace 14 is covered with the heat insulating material 16, by increasing the concentration of the nitrogen gas in the temperature lowering step E4 to be higher than that of the temperature raising step E1 and the single crystal growing step E2 to promote the endothermic reaction of nitrogen. In the step E4, the concentration of the nitrogen gas is preferably maintained to be constant.

Note that nitrogen monoxide (NO) and the like generated by the promotion of the endothermic reaction of nitrogen are quickly suctioned to the outside of the crystal growing furnace 14 by the decompression means (vacuum pump) 18. Therefore, it is possible to suppress degradation of the furnace wall and the heat insulating material 16 included in the crystal growing furnace 14 due to nitrogen oxides (NOx).

After the temperature in the crystal growing furnace 14 is cooled to the room temperature, the silicon carbide single crystal 22 that has grown is extracted from the crystal growing furnace 14 along with the silicon carbide seed crystal 21. The extracted silicon carbide seed crystal 21 and silicon carbide single crystal 22 may be used as a silicon carbide ingot as a whole. Also, the silicon carbide seed crystal 21 and the silicon carbide single crystal 22 that has been made to grow may be separated from each other. A method of removing the silicon carbide seed crystal 21 from the silicon carbide single crystal 22 is not particularly limited, and for example, a mechanical removing method such as cutting, grinding, or cleavage can be used.

According to the method of manufacturing a silicon carbide single crystal ingot of the invention as described above, the concentration of the nitrogen gas in the temperature lowering step E4 is increased to be higher than that in the temperature raising step E1 and the single crystal growing step E2 to promote the endothermic reaction of nitrogen. In this manner, it is possible to shorten the necessary time for the temperature lowering step E4 in which it is difficult to cool the crystal growing furnace 14 since the crystal growing furnace 14 is covered with the heat insulating material 16.

Also, it is possible to suppress costs required to shorten the necessary time for the temperature lowering step E4 by using nitrogen that is obtained at significantly low costs as compared with rare gas in the invention, as compared with a case in which the flow rate of rare gas such as argon gas is increased to promote the cooling of the crystal growing furnace 14, for example.

EXAMPLES

The effects of the invention were reviewed by manufacturing silicon carbide single crystals.

For the review, the silicon carbide single crystal manufacturing apparatus 10 as shown in FIG. 1 was used.

In an example of the invention, the concentration of the nitrogen gas in the crystal furnace 14 in the temperature lowering step E4 was set to 56 vol %. Then, an elapsed time from the start of the temperature lowering step E4 and a change in the temperature in the crystal growing furnace 14 were measured. The starting temperature of the temperature lowering step E4 was set to 2400° C.

In a comparative example, the concentration of the nitrogen gas in the crystal growing furnace 14 in the temperature lowering step E4 was set to 0 vol % (not containing nitrogen gas). Then, an elapsed time from the start of the temperature lowering step E4 and a change in the temperature in the crystal growing furnace 14 were measured.

Figure 3:
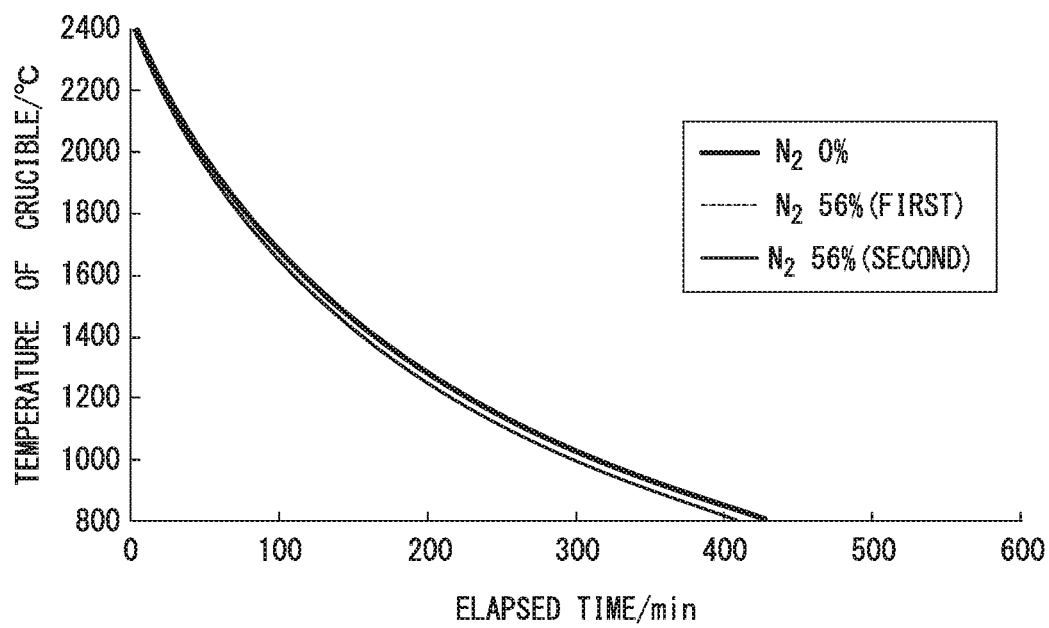
FIG. 3 is a graph showing a result of reviewing the manufacturing method according to the invention.

Results of such review are shown in the graph of FIG. 3. Also, FIG. 4 is an enlarged graph of a main part in FIG. 3.

Figure 4:
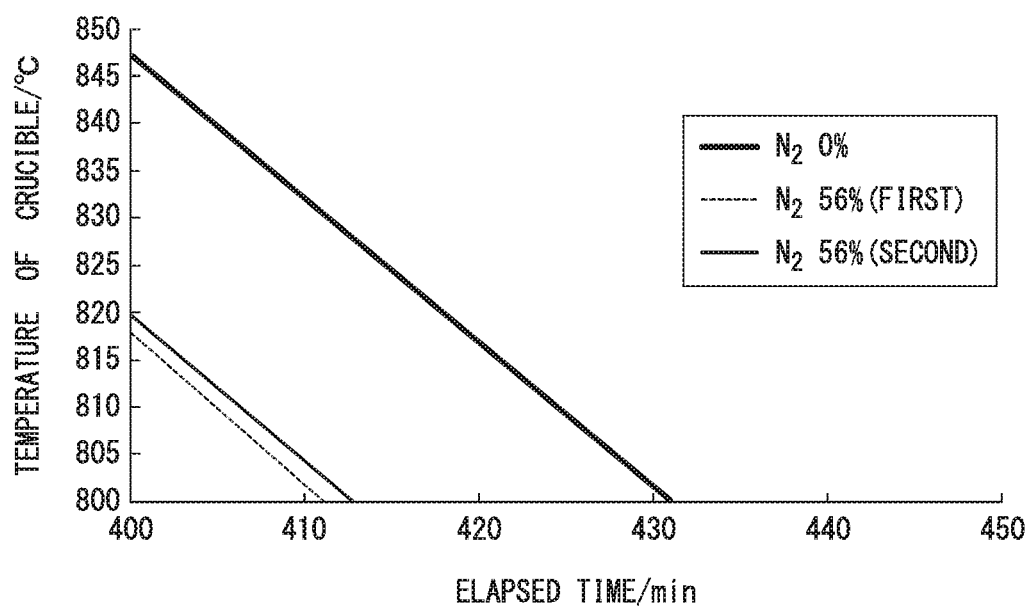
FIG. 4 is a graph showing a result of reviewing the manufacturing method according to the invention.

According to the results of review shown in FIGS. 3 and 4, it was confirmed that the cooling speed was increased, and it was possible to perform the cooling in a shorter time in the example of the invention in which the concentration of the nitrogen gas in the crystal growing furnace 14 was increased to 56 vol % in the temperature lowering step E4, as compared with the comparative example in which no nitrogen gas was contained in the temperature lowering step E4.

Note that the review of the effects of the invention was performed twice under the same conditions for confirmation. The results obtained in the case in which $N_2$ is 56% are represented by two kinds of lines, namely the straight line and the dotted line in FIGS. 3 and 4, and these are the results of the experiment performed twice under the same conditions.

While preferred embodiments of the invention have been described and shown above, it should be understood that these are exemplary examples of the invention and are not to be considered as limiting. The embodiments may be performed by various other forms. Additions, omissions, substitutions, and other modifications can be made without departing from the spirit or scope of the present invention. The embodiments and another variation thereof are included in the scope of the invention and the content thereof. Accordingly, the invention is not to be considered as being limited by the foregoing description, and is only limited by the scope of the appended claims.

EXPLANATION OF REFERENCES

10: Silicon carbide single crystal manufacturing apparatus
14: Crystal growing furnace (crucible)
15: Heating means
16: Heat insulating material
18: Decompression means (vacuum pump)
19: Gas supply means
21: Silicon carbide seed crystal
22: Silicon carbide single crystal 23: Silicon carbide raw material
C1: Initial setting concentration (concentration of nitrogen gas)
C2: Concentration during temperature lowering
E1: Temperature raising step
E2: Single crystal growing step
E3: Temperature lowering preparation step
E4: Temperature lowering step
T1: Crystal growing temperature

The invention claimed is:

1. A method of manufacturing a silicon carbide single crystal ingot in which a silicon carbide single crystal is made to grow on a silicon carbide seed crystal in a mixture gas containing nitrogen at a temperature of 2000° C. or higher in a crystal growing furnace, the method comprising:
   a temperature raising step of raising a temperature in the crystal growing furnace with a silicon carbide raw material and the silicon carbide seed crystal arranged therein to a crystal growing temperature;
   a single crystal growing step of maintaining the crystal growing temperature and causing the silicon carbide single crystal to grow on the silicon carbide seed crystal; and
   a temperature lowering step of lowering the temperature in the crystal growing furnace from the crystal growing temperature to stop growth of the silicon carbide single crystal,
   wherein the method further comprises, between the single crystal growing step and the temperature lowering step, a temperature lowering preparation step of maintaining the temperature in the crystal growing furnace at the crystal growing temperature and causing a volume ratio of nitrogen gas in the mixture gas in the crystal growing furnace to increase so as to be higher than the volume ratio of nitrogen gas in the mixture gas in the temperature raising step and in the single crystal growing step, and
   wherein the volume ratio of the nitrogen gas in the mixture gas in the crystal growing furnace in the temperature lowering step is higher than the volume ratio of the nitrogen gas in the mixture gas in the temperature raising step and the single crystal growing step.

2. The method of manufacturing a silicon carbide single crystal ingot according to claim 1,
   wherein the temperature lowering preparation step is performed within a range of equal to or greater than 5 hours and equal to or less than 15 hours.

3. The method of manufacturing a silicon carbide single crystal ingot according to claim 1,
   wherein the volume ratio of the nitrogen gas in the mixture gas in the crystal growing furnace in the temperature lowering step is set to be equal to or greater than 30 vol %.

4. The method of manufacturing a silicon carbide single crystal ingot according to claim 1,
   wherein in the temperature lowering step, a temperature lowering speed is increased by an endothermic reaction of the nitrogen gas in the crystal growing furnace.

5. The method of manufacturing a silicon carbide single crystal ingot according to claim 1,
   wherein the method of manufacturing a silicon carbide single crystal ingot is a sublimation method.

6. The method of manufacturing a silicon carbide single crystal ingot according to claim 1,
   wherein the volume ratio of the nitrogen gas in the mixture gas in the temperature raising step is the same as the volume ratio of the nitrogen gas in the mixture gas in the single crystal growing step.

7. The method of manufacturing a silicon carbide single crystal ingot according to claim 1,
   wherein a highest volume ratio of the nitrogen gas in the mixture gas in the temperature lowering preparation step is the same as the volume ratio of the nitrogen gas in the mixture gas in the temperature lowering step.

* * * * *